United States Patent
Kogure

(10) Patent No.: US 6,273,945 B1
(45) Date of Patent: Aug. 14, 2001

(54) SINGLE CRYSTAL PRODUCING APPARATUS AND METHOD

(75) Inventor: Yasuhiro Kogure, Hyogo (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/395,560

(22) Filed: Sep. 14, 1999

(30) Foreign Application Priority Data

Sep. 14, 1998 (JP) .................................................. 10-260288

(51) Int. Cl.⁷ .................................................... C30B 15/32
(52) U.S. Cl. .............................................................. 117/13
(58) Field of Search ................................. 117/13, 14, 15, 117/201, 202, 911

(56) References Cited

U.S. PATENT DOCUMENTS 4,663,128 * 5/1987 Heigeland ............................ 117/201
6,042,644 * 3/2000 Kurosaka et al. ...................... 117/13
6,113,686 * 9/2000 Iino et al. ................................ 117/13

* cited by examiner

*Primary Examiner*—Felisa Hiteshew
(74) *Attorney, Agent, or Firm*—Morrison & Foerster, LLP

(57) ABSTRACT

A silicon single crystal producing apparatus and method are disclosed. Contamination of a hot molten liquid due to a chuck mechanism is prevented where an upper end part of the silicon single crystal is gripped by the chuck mechanism and is raised after the silicon single crystal is produced. Elevation and rotation of the chuck mechanism can be controlled independently of elevation and rotation of a pulling wire. Before the upper end part of the silicon single crystal is gripped at a bottom part of a pull chamber, the chuck mechanism is set at a standby position at a top of the pull chamber. The chuck mechanism is lowered from the standby position to the grip position. A rotation frequency of the chuck mechanism during lowering is selected as a rotation frequency free of resonance. After lowering and gripping of the silicon single crystal, the chuck mechanism is raised while being rotated in synchronism with the pulling wire.

11 Claims, 2 Drawing Sheets

1) EXAMPLE OF THE PRESENT INVENTION
2) REFERENCE EXAMPLE
3) COMPARATIVE EXAMPLE 1
4) COMPARATIVE EXAMPLE 2

1) EXAMPLE OF THE PRESENT INVENTION
2) REFERENCE EXAMPLE
3) COMPARATIVE EXAMPLE 1
4) COMPARATIVE EXAMPLE 2

SINGLE CRYSTAL PRODUCING APPARATUS AND METHOD

CROSS REFERENCE TO RELATED APPLICATION

The application claims priority under 35 U.S.C. §119 from Japanese Patent Application Serial No. 10-260,288 which is incorporated herein by reference.

BACKGROUND OF THE INVENTION

1. Field of the Invention

The present invention relates to a single crystal producing apparatus for producing a single crystal by pulling using the Czochralski (CZ) method and a single crystal producing method using the producing apparatus.

2. Description of the Related Art

As an element material of a silicon wafer used for manufacture of a semiconductor device, a silicon single crystal produced by the CZ method is frequently used. In producing the silicon single crystal by the CZ method, as is well known, a seed crystal held at a lower end of a pulling wire is immersed in a molten silicon liquid formed in a quartz crucible. The pulling wire is then raised while the shaft is rotated, thereby producing a silicon single crystal below the seed crystal.

Here, the seed crystal is a thin rod body comprising the silicon crystal of some tens of millimeters in diameter. An upper part thereof is linked with a seed holder and a lower part thereof is immersed in the molten silicon liquid. When such a seed crystal is immersed in a hot molten silicon liquid, dislocation is introduced due to thermal shock. Therefore, the seed crystal is narrowed in diameter after the crystal has been immersed in the molten silicon liquid. For a while, this state is maintained, and so-called seed contraction is implemented to ensure no dislocation of the crystal. The diameter of the seed at its narrow part is required to 5 mm or less to ensure no dislocation, and preferably is desired to be 3 mm or less.

On the other hand, a silicon single crystal, 8 inches in diameter and about 100 kg in weight produced by the CZ method, has been preferred. However, recently, the diameter of the single crystal has been further increased, and production of a silicon single crystal of 12 inches in diameter is starting. When the diameter of the single crystal is increased, of course, its weight is increased. In the case of the crystal 12 inches in diameter, the weight reaches 200 kg. This weight particularly concentrates in a seed contraction portion of the seed crystal. However, since destruction strength of silicon is about 20 kg /mm$^2$, a seed contraction portion exceeding at least 5 mm is required to hold reliably a silicon single crystal of 200 kg in weight. Therefore, it is impossible to pull a single crystal of 12 inches in diameter from a hot molten silicon liquid pool.

As a very efficient technique eliminating this problem, making it possible to produce a 12-inch single crystal, a pulling technique independent of seed crystals is disclosed in Japanese Patent Publication No. 5-65477. In this technique, a narrowing portion is at an upper end part and this narrowing portion is additionally gripped by a chuck mechanism to pull the single crystal. The chuck mechanism is provided with a plurality of claw members for clamping the narrowing portion of the single crystal at its periphery. The plurality of claw members are raised and rotated in synchronism with the seed crystal, i.e. a seed holder and the pulling wire, thereby performing pulling of the single crystal.

In this pulling technique, the chuck mechanism carries the entire load of a single crystal, thus making it possible to produce a single crystal exceeding 12 inches. In an earlier technique disclosed in Japanese Patent Publication No. 5-65477, a chuck mechanism is integrated with a seed holder. With this structure, during chuck mechanism pulling, the chuck mechanism is completely synchronized with the seed holder to perform steps of rotating and raising. However, when a seed crystal is immersed in a hot molten liquid or before and after the immersion, the chuck mechanism approaches the hot molten liquid and is subjected to a high-temperature atmosphere exceeding 1000° C. Thus, there is a problem that the hot molten liquid is contaminated by metal from the chuck mechanism. In addition, there is another problem that, even if a molybdenum material or plating is employed for the chuck mechanism to prevent such contamination, a slide portion is scorched in a high-temperature atmosphere exceeding 1000° C., making it impossible to perform a gripping operation.

To solve these problems, there is provided a technique for elevating a chuck mechanism independently of a seed holder. In this technique disclosed in Japanese Laid-Open Patent Application No. 9-227282, the chuck mechanism is elevated and driven by a motor independent of the motor for elevating the pulling wire. According to this technique, there is no need for lowering the chuck mechanism to the vicinity of the hot molten liquid because an upper end part of the silicon single crystal can be grasped in the middle and the chuck mechanism can be set at a standby position in a low-temperature area. In this manner, the chuck mechanism is temporarily held in a low-temperature area distant from the hot molten liquid, and overheating of the chuck mechanism and contamination of the hot molten liquid are prevented. When the upper end part of the single crystal is gripped and the chuck mechanism is later raised in synchronism with the pulling wire, there is no problem in pulling the chuck mechanism.

However, even in the prior art disclosed in Japanese Laid-Open Patent Application No. 9-227282, it was found that overheating of the chuck mechanism and contamination of the hot molten liquid are not eliminated. These problems still occur because, when the chuck mechanism is set at a standby position higher than the grip position, the chuck mechanism must be set at the standby position near to the grip position due to an occurrence of resonation during lowering to the grip position and frequent occurrences of dislocations happen. Reasons why resonation occur during the lowering of the chuck mechanism are as follows.

In the prior art disclosed in Japanese Laid-Open Patent Application No. 9-227282, a mechanism for elevating the chuck mechanism is integrated with a mechanism for rotating the pulling wire. By this integration, the chuck mechanism is always rotated in synchronism with the pulling wire. This synchronous rotating movement of the pulling wire and the chuck mechanism is indispensable when gripping the single crystal and during subsequent pulling of the single crystal. On the other hand, when the chuck mechanism is lowered to the grip position, such movement causes the chuck mechanism to be vibrated in a horizontal direction.

In other words, the chuck mechanism is suspended by a plurality of wires for the purpose of raising it and is lowered to the grip position by feeding out these wires downwardly. The mechanism is integrated with a rotational mechanism for the pulling wire. Thus, the chuck mechanism is rotated at a constant speed identical to a rotation speed of the pulling wire during the lowering step. At this time, assuming that an effective length of a suspension wire is L, and gravity is 'g', the following Equation 1 is met.

$$\text{Resonance rotation frequency} = (\tfrac{1}{2}\pi)\cdot(g/L)^{1/2} 60 \text{ rpm [Equation 1]}$$

During lowering of the chuck mechanism, the effective length 'L' of the suspension wire increases successively. Equation 1 represents that, if the rotation frequency in lowering the chuck mechanism is set at a constant speed governed by the rotation frequency of the pulling wire, resonance occurs when the effective length 'L' of the suspension wire becomes a specific length. In other words, resonance occurs in the middle of the chuck mechanism being lowered to the grip position and the chuck mechanism starts vibrating greatly in the horizontal direction. Once this vibration occurs, even if the chuck mechanism is rotated in synchronism with the pulling wire, it causes great external force in the horizontal direction to be applied to the single crystal during gripping of the single crystal, producing dislocation of the single crystal or crystal drop accidents.

Thus, in the prior art disclosed in Japanese Laid-Open Patent Application No. 9-227282, in the case where the chuck mechanism is set at a standby position which is higher than the grip position, resonation occurs in the middle of its lowering from the standby position to the grip position, and dislocation frequently occurs, thus making it necessary to set the chuck mechanism standby position at the grip position. As a result, contamination of the hot molten liquid or thermal deterioration of the chuck mechanism cannot be sufficiently prevented.

The standby position is made higher with the raising of the grip position. However, if the grip position is raised, the seed contraction portion breaks upon gripping, and a single crystal may drop. The grip position is restricted to about 50% or less of the pulling length. At such a position, the chuck mechanism is distant from the hot molten liquid, but the distance is not too long. However, the standby time is long. Thus, the hot molten liquid is inevitably contaminated, so that the chuck mechanism thermally deteriorates.

SUMMARY OF THE INVENTION

An object of the present invention is to provide a single crystal producing apparatus and a method capable of preventing contamination of a hot molten liquid or thermal deterioration of a chuck mechanism, and moreover, to prevent dislocation due to resonance.

To attain the above-mentioned object, a single crystal producing apparatus according to the present invention is provided with a first pulling device for holding a seed crystal at a lower end of a pulling wire and for raising the pulling wire while the pulling wire is rotated from a state in which the seed crystal is immersed in the hot molten liquid in a crucible, thereby producing a single crystal below the seed crystal. The apparatus is also provided with a second pulling device for raising a chuck mechanism for gripping an upper end part of a produced crystal while the chuck mechanism is rotated in synchronism with the pulling wire, thereby pulling up the produced crystal. Thus, the second pulling device is capable of controlling rotation and elevation of the chuck mechanism independent of the pulling wire.

The single crystal producing method according to the present invention is directed to a method for producing a single crystal using the single crystal producing apparatus, wherein a chuck mechanism is set at a standby position which is higher than a grip position until an upper end part of the produced crystal has been gripped by the chuck mechanism. The chuck mechanism is lowered to the grip position at a rotation frequency free of resonance. When the upper end part of the produced crystal is gripped by the chuck mechanism, the chuck mechanism is raised while being rotated in synchronism with the pulling wire.

In the single crystal producing apparatus and the method according to the present invention, rotation and elevation of the chuck mechanism are controlled independently of rotation and elevation of the pulling wire, thus making it possible to set a rotation speed of the chuck mechanism without being dependent on a rotation speed of the pulling wire. Therefore, its rotation frequency (including 0) which does not meet Equation 1 can be selected, and resonance during lowering can be prevented.

It is preferable that the standby position of the chuck mechanism is more distant from the hot molten liquid. Specifically, it is preferable that the standby position is located at the top inside a pull chamber for pulling the produced crystal. A standby position at an atmospheric temperature of 500° C. or less is preferable.

A position for gripping the produced crystal by the chuck mechanism is preferably 40 to 50% of the pulling length, and specifically, near the lower part inside the pull chamber. When the crystal is gripped quickly, the chuck mechanism fast approaches the hot molten liquid. When it is gripped slowly, there is a danger of producing breaks at a seed contraction portion. Thus, a gripping position at an atmospheric temperature of 300 to 500° C. is preferable.

DETAILED DESCRIPTION OF THE INVENTION

Figure 1:
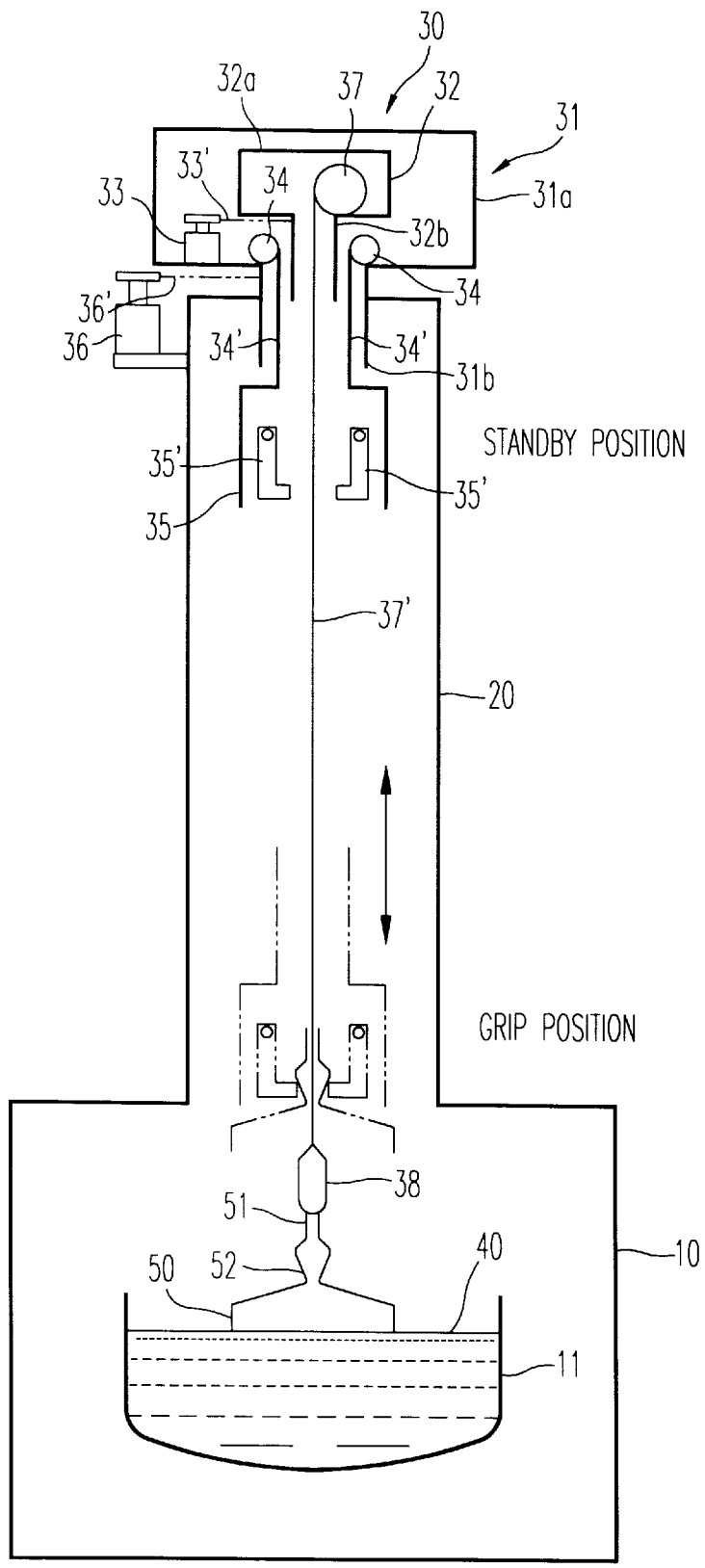
FIG. 1 is a view of an apparatus configuration showing a single crystal producing apparatus according to the present invention.

Hereinafter, an embodiment of the present invention will be described with reference to the drawings in which FIG. 1 is a view of a configuration of a single crystal producing apparatus.

The single crystal producing apparatus according to this embodiment is provided with a main chamber 10, a pull chamber 20 of a smaller diameter linked onto the chamber 10, and a rotational pulling mechanism 30 mounted on a top end part of the pull chamber 20.

A crucible 11 is installed in the main chamber 10. The crucible 11 has a double-layered structure for holding an interior quartz crucible and an exterior graphite crucible. In the quartz crucible, a hot molten silicon liquid 40 is formed by a heater disposed outside of the crucible 11. A silicon single crystal 50 is pulled up from the hot molten liquid 40. At a further point outside of the crucible 11, a heat insulation material is disposed along an interior face of the main chamber 10.

The rotational pulling mechanism 30 is provided with a first pulling device for performing initial pulling of a single crystal 50 using a seed crystal 51 and a second pulling device for pulling the single crystal 50 on its way up. Specifically, a first rotation drum 31 is concentrically mounted onto the top of the pull chamber 20. A second rotation drum 32 of a diameter smaller than the first drum 31 is concentrically arranged inside the first drum 31.

The first rotation drum 31 consists of a large diameter portion 31a disposed upwardly of the pull chamber 20 and a small diameter portion 31b linked downwardly and inserted into the pull chamber 20, and rotatably mounted to the pull chamber 20. A first motor 33 capable of speed control is mounted to the top exterior face of the pull chamber 20. The first motor 33 rotationally drives the second rotation drum 32 in a circumferential direction via a chain 33'.

In the large diameter portion 31a, a plurality of first winches 34 is provided for winding and feeding a plurality of first wires 34' in synchronism. This plurality of wires 34' is symmetrically suspended around a center line in the pull chamber 20 through the inside of the small diameter portion 31b. A chuck mechanism 35 is linked at a lower end part of the wires 34'. The chuck mechanism 35 provides a known structure capable of gripping a narrow portion 52 formed at an upper end part of the silicon single crystal 50. For example, the chuck mechanism 35 is configured by a plurality of movable claws 35' symmetrically disposed around the center line of the pull chamber 20. The claws 35' are remotely opened and closed.

The second rotation drum 32 comprises a large diameter portion 32a arranged in the large diameter portion 31a of the first rotation drum 31 and a small diameter portion 32b linked downwardly and inserted into the small diameter portion 31b of the first rotation drum 31. A second motor 36 is provided for the large diameter portion 31a of the first rotation drum 31. The second motor 36 rotationally drives in a circumferential direction the first rotation drum 31 via a chain 36'.

In the large diameter portion 32a of the second rotation drum 32, a second winch 37 for winding and feeding a second wire 37' serves as a pulling wire or shaft. The wire 37', is suspended at the center position in the pull chamber 20 through the inside of the small diameter portions 32b and 31b. A seed holder 38 holding the seed crystal 51 is linked with a lower end part of the wire 37'.

The second rotation drum 32, the first motor 33, the second winch 37, and the seed holder 38 belong to the first pulling device for performing initial pulling of the silicon single crystal 50 using the seed crystal 51. The first rotation drum 31, the second motor 36, the first winch 34, and the chuck mechanism 35 belong to the second pulling device for pulling the silicon single crystal 50 on its way up. The second pulling device is provided with the winch 34 and the motor 36 independent of the first pulling device. Thus, elevation and rotation of the chuck mechanism 35 can be performed independently of the elevation and rotation of the seed holder 38 via the pull chamber 20.

Next, a specific method for producing the single crystal using the single crystal producing apparatus will be described by referring to an embodiment of the single crystal producing method according to the present invention.

The insides of the main chamber 10 and the pull chamber 20 are vacuum-evacuated and are held in a predetermined depressurized atmosphere. The hot molten liquid 40 is formed in the crucible 11. At this time, the chuck mechanism 35 and the seed holder 38 are set at standby positions on the top of the pull chamber 20. In addition, the seed crystal 51 is held in the seed holder 38.

When the hot molten liquid 40 is formed in the crucible 11, the second winch 37 is actuated to feed the wire 37' downwardly so that the seed holder 38 and the seed crystal 51 are lowered. After the seed crystal 51 has been immersed in the hot molten liquid 40, the second winch 37 again is actuated in the reverse direction to start pulling up the single crystal 50. At this time, the first motor 33 is actuated to rotate the wire 37', the seed holder 38, and the seed crystal 51 at a predetermined speed. In addition, the crucible 11 is rotated in the reverse direction.

At the start of pulling, the raising speed of the seed crystal 51 is controlled and seed contraction is performed. After seed contraction has been completed, diameter reduction is performed again, thereby forming the narrow portion 52 at the upper end part of the silicon single crystal 50.

When pulling of the single crystal 50 is advanced and its upper end part reaches a low-temperature area of 1000° C. or less, for example at the lower end part of the pull chamber 20, the first winch 34 is actuated to lower the chuck mechanism 35 from an upper retracted position to the same level as the upper end part of the single crystal 50. At this time, the second motor 36 is actuated to rotate the chuck mechanism 35 in the same direction as the seed holder 38 while pulling or lowering the chuck mechanism 35. When the chuck mechanism 35 is rotated, a rotation frequency which does not meet Equation 1 is selected. Thereby, resonance caused when the chuck mechanism 35 is lowered is prevented. Even when the chuck mechanism 35 is not rotated, resonance caused while lowering is prevented.

When the chuck mechanism 35 is lowered to the same level as the upper end part of the single crystal 50, the first winch 34 is actuated in the reverse direction and the chuck mechanism is raised in synchronism with the seed crystal 51. In addition, the chuck mechanism 35 is rotated in synchronism with the seed crystal 51 by actuation of the first motor 33. Further, the narrow portion 52 formed at the upper end part of the single crystal 50 is gripped by the chuck mechanism 35, thereby starting to pull up the single crystal 50 using the chuck mechanism 35.

In this manner, even if the single crystal 50 is heavy in weight, dropping of the single crystal 50 due to breakage of the seed contraction portion is prevented, making it possible to pull a predetermined length. In addition, the chuck mechanism 35 is set at the standby position on the top of the pull chamber 20 until the single crystal 50 has been gripped and the chuck mechanism 35 is lowered only to the bottom of the pull chamber 20. Thus, malfunction due to contamination of the hot molten liquid 40 while using the chuck mechanism 35 and overheating of the chuck mechanism 35 is effectively prevented. Furthermore, although the chuck mechanism 35 is set at the standby position higher than the grip position, resonance caused when the chuck mechanism 35 is lowered to the grip position is reliably prevented as described previously. Thus, dislocation due to such resonance is prevented.

EXAMPLES

In the case where an 8-inch silicon single crystal is produced, the above-mentioned single crystal producing method was carried out. The chuck mechanism was set at a standby position on the top (atmospheric temperature of about 100° C.) of the pull chamber and was lowered until the silicon single crystal had been gripped. The rotation frequency (2 rpm) did not meet Equation 1. In other words, the rotation frequency of the pulling wire for the seed holder at this time is 15 rpm. In addition, the grip position is located at the bottom (atmospheric temperature of about 500° C.) of the pull chamber, and the rate of the pulling distance to the wire length is 40% to 50%.

Figure 2:
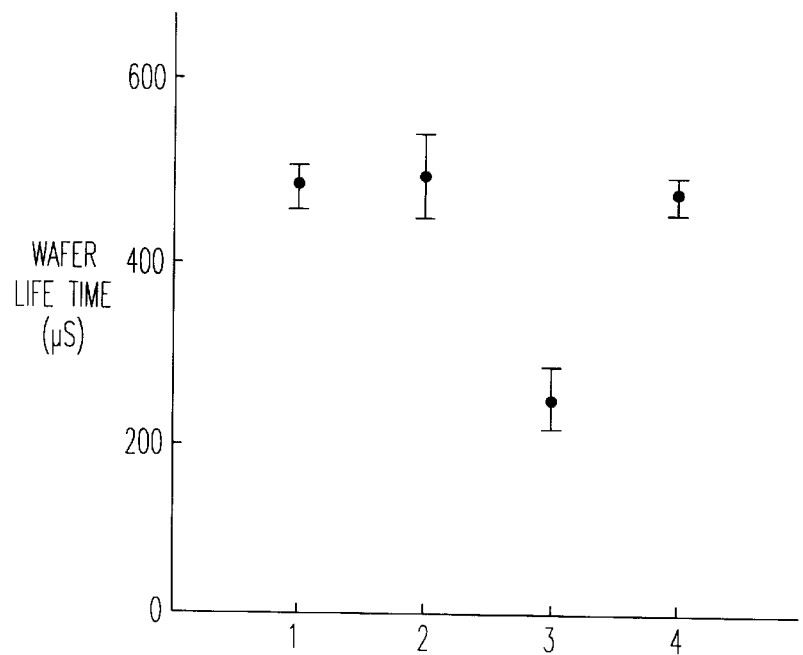
FIG. 2 is a graph depicting an effect of the present invention on the life time of a silicon wafer.
Figure 3:
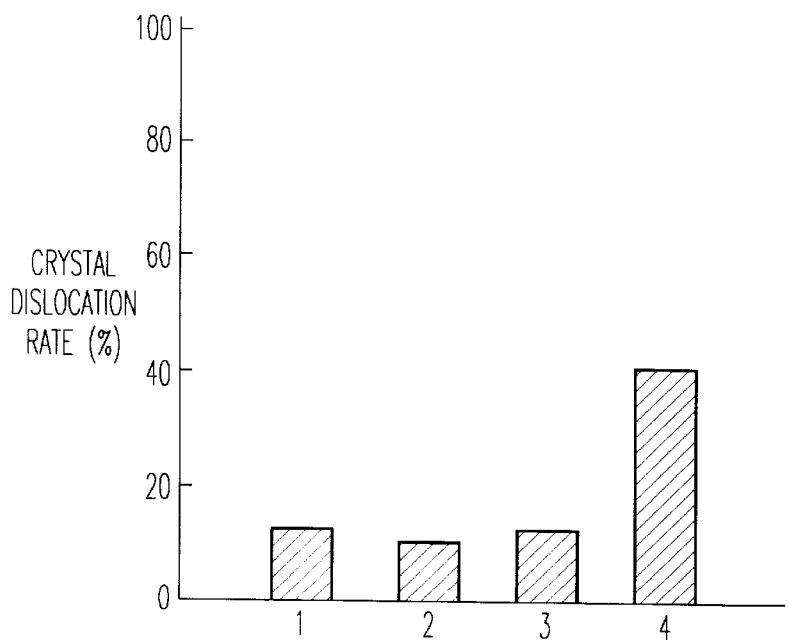
FIG. 3 is a graph showing an effect of the present invention by dislocation rate.

A life time, which is an indicator of heavy metal contamination in a wafer cut out from a bottom part of the produced silicon crystal, was measured. The measurement result is shown in FIG. 2 as an example of the present invention. In addition, the result of an investigation of the dislocation rate during single crystal production is shown in FIG. 3 as an example of the present invention.

As a reference example, a single crystal was produced without using any chuck mechanism. The results obtained at this time are also shown in FIGS. 2 and 3.

As a Comparative Example 1, the chuck mechanism was set at the standby position at the lowest end part of the pull chamber. This lowest end part is the grip position. The standby time was about 20 hours until a silicon single crystal had been gripped from raw material melting. The results obtained at this time are shown in FIGS. 2 and 3.

As a Comparative Example 2, the chuck mechanism was set at the standby position at the top of the pull chamber until a silicon single crystal had been gripped. The chuck mechanism was lowered while being rotated in synchronism with the pulling wire to the grip position. The results obtained at this time are shown in FIGS. 2 and 3.

As seen from FIGS. 2 and 3, in examples of the present invention, wherein the chuck mechanism was set at the standby position at the top of the pull chamber, from which the chuck mechanism was lowered to the grip position at a rotation frequency which does not meet Equation 1, heavy metal contamination of the hot molten liquid and dislocation were prevented.

However, in the Comparative Example 1, wherein the chuck mechanism was set at the standby position at the bottom of the pull chamber, dislocation due to use of the chuck mechanism hardly occurred, but heavy metal contamination of the hot molten liquid due to use of the chuck mechanism was clearly observed. On the other hand, in the Comparative Example 2, wherein the chuck mechanism was lowered to the grip position while the chuck mechanism was rotated in synchronism with the pulling wire, heavy metal contamination of the hot molten liquid due to use of the chuck mechanism hardly occurred, but dislocation due to resonance during lowering frequently occurred.

As it is apparent from the foregoing description, in the single crystal producing apparatus and method according to the present invention, rotation and elevation of the chuck mechanism for gripping the upper end part of the silicon single crystal is controlled independently of rotation and elevation of the pulling wire, thereby making it possible to prevent dislocation due to resonance by setting the chuck mechanism at a standby position higher than the grip position. As a result, heavy metal contamination of the hot molten liquid or thermal deterioration of the chuck mechanism itself can be effectively prevented.

What is claimed is:

1. A silicon single crystal producing method comprising the steps of:
   setting a chuck mechanism at a standby position above a grip position;
   lowering the chuck mechanism from the standby position to the grip position at a rotation frequency free of resonance;
   gripping an upper end part of a produced single crystal by the chuck mechanism; and
   rotating and raising the chuck mechanism in synchronism with a pulling wire.

2. The silicon single crystal producing method as set forth in claim 1 wherein an Equation:

$$\text{Resonance frequency} = (\tfrac{1}{2}\pi) \cdot g \cdot L)^{1/2} \cdot 60 \text{ rpm}$$

with L representing an effective length of first wires which suspend the chuck mechanism and g representing gravity is not met by the rotation frequency of the chuck mechanism.

3. The silicon single crystal producing method as set forth in claim 1, wherein the grip position is located lower than the standby position of the chuck mechanism by 40% to 50% of a length of the pulling wire.

4. A silicon single crystal producing method, comprising:
   a first pulling device that lowers and raises a pulling wire while the pulling wire is rotated;
   a seed crystal held at a lower end of the pulling wire;
   a crucible in which the seed crystal is immersed in a hot molten liquid;
   a chuck mechanism which grips an upper end part of a produced single crystal;
   a second pulling device that lowers and raises the chuck mechanism; and
   a device that rotates the chuck mechanism in synchronism with rotation of the pulling wire,
   wherein the second pulling device is capable of independently controlling rotation and elevation of the chuck mechanism with respect to the pulling wire.

5. The silicon single crystal producing method as set forth in claim 4, wherein the chuck mechanism includes a plurality of movable claws that grip a narrow portion formed at the upper end part of the produced silicon single crystal.

6. The silicon single crystal producing method as set forth in claim 4, wherein the first pulling device includes a winch, a rotation drum being mounted at a top of the pulling wire, and a motor that rotationally drives the drum.

7. The silicon single crystal producing method as set forth in claim 4, wherein the second pulling device includes another winch, another rotation drum, and another motor that rotationally drives independently of the other rotation drum.

8. A silicon single crystal producing apparatus comprising:
   a first pulling device that lowers and raises a pulling wire while the pulling wire is rotated;
   a seed crystal held at a lower end of the pulling wire;
   a crucible in which the seed crystal is immersed in a hot molten liquid;
   a chuck mechanism which grips an upper end part of a produced single crystal;
   a second pulling device that lowers and raises the chuck mechanism; and
   a device that rotates the chuck mechanism in synchronism with rotation of the pulling wire;
   wherein the second pulling device is capable of independently controlling rotation and elevation of the chuck mechanism with respect to the pulling wire.

9. The silicon single crystal producing apparatus as set forth in claim 8, wherein the chuck mechanism includes a plurality of movable claws that grip a narrow portion formed at the upper end part of the produced silicon single crystal.

10. The silicon single crystal producing apparatus as set forth in claim 8, wherein the first pulling device includes a winch, a rotation drum being mounted at a top of the pulling wire, and a motor that rotationally drives the drum.

11. The silicon single crystal producing apparatus as set forth in claim 10, wherein the second pulling device includes another winch, another rotation drum, and another motor that rotationally drives independently of the other rotation drum.

* * * * *